United States Patent
Seon

(10) Patent No.: US 6,489,644 B1
(45) Date of Patent: Dec. 3, 2002

(54) SEMICONDUCTOR MEMORY DEVICE AND METHOD FOR FABRICATING THE SAME

(75) Inventor: Jeong Min Seon, Chollanam-do (KR)

(73) Assignee: LG Semicon Co., Ltd., Chungcheongbuk-do (KR)

(*) Notice: Subject to any disclaimer, the term of this patent is extended or adjusted under 35 U.S.C. 154(b) by 0 days.

(21) Appl. No.: 09/635,437

(22) Filed: Aug. 11, 2000

Related U.S. Application Data

(62) Division of application No. 09/071,913, filed on May 5, 1998, now Pat. No. 6,136,639.

(30) Foreign Application Priority Data

Dec. 26, 1997  (KR) .............................................. 97-74389

(51) Int. Cl.[7] .......................... H01L 29/76; H01L 29/94; H01L 21/8242
(52) U.S. Cl. ............................ 257/295; 437/239; 437/3
(58) Field of Search ................................ 438/238, 239, 438/240, 3; 257/295, 627, 310, 532, 533, 540, 763

(56) References Cited

U.S. PATENT DOCUMENTS

| | | | |
|---|---|---|---|
| 5,248,564 A | * 9/1993 | Ramesh | 428/688 |
| 5,519,235 A | * 5/1996 | Ramesh | 257/295 |
| 5,689,456 A | * 11/1997 | Kobayashi | 365/145 |
| 5,796,648 A | 8/1998 | Kawakubo et al. | 365/145 |
| 5,818,079 A | 10/1998 | Noma et al. | 257/295 |
| 5,837,591 A | 11/1998 | Shimada et al. | 438/381 |
| 5,851,896 A | 12/1998 | Summerfelt | 438/396 |
| 5,929,475 A | 7/1999 | Uemoto et al. | 257/295 |
| 5,985,757 A | 11/1999 | Lee et al. | 438/650 |
| 5,998,250 A | 12/1999 | Andricacos et al. | 438/240 |
| 6,004,392 A | * 12/1999 | Isobe et al. | 117/88 |

OTHER PUBLICATIONS

K. Sreenivas et al., "Investigation of Pt/Ti Bilayer Metallization on Silicon for Ferroelectric Thin Film Integration", J. Appl. Phys., vol. 75, No. 1, Jan. 1994, pp. 232–239.

* cited by examiner

*Primary Examiner*—Caridad Everhart
*Assistant Examiner*—Calvin Lee
(74) *Attorney, Agent, or Firm*—Morgan, Lewis & Bockius LLP

(57) ABSTRACT

A semiconductor memory device and method of fabricating the same, which improves adhesion of the lower electrode of a ferroelectric planar capacitor, and prevents inter-diffusion between the Pt electrode of the capacitor and adhesion layer placed under the Pt electrode. The semiconductor memory device includes an insulating layer formed on a substrate, a paraelectric layer formed on the insulating layer, and a conductive layer formed on the paraelectric layer.

11 Claims, 11 Drawing Sheets

| No. | 2-Theta | intensity | distance(Å) | I/IO |
|---|---|---|---|---|
| ① | 35.63 | 185 | 2.51 | 0 |
| ② | 39.75 | 102400 | 2.26 | 100 |
| ③ | 85.82 | 3277 | 1.13 | 3 |

| No. | 2-Theta | intensity | distance(Å) | I/IO |
|---|---|---|---|---|
| ① | 22.22 | 300 | 3.98 | 34 |
| ② | 31.83 | 11 | 2.80 | 1 |
| ③ | 45.45 | 915 | 1.99 | 100 |

| No. | 2-Theta | intensity | distance(Å) | I/I0 |
|---|---|---|---|---|
| ① | 22.31 | 349 | 3.98 | 0 |
| ② | 23.13 | 85 | 3.84 | 0 |
| ③ | 31.82 | 15 | 2.80 | 0 |
| ④ | 40.01 | 5448 | 2.25 | 6 |
| ⑤ | 41.83 | 147 | 2.15 | 0 |
| ⑥ | 45.38 | 689 | 1.99 | 1 |
| ⑦ | 46.59 | 84353 | 1.94 | 100 |
| ⑧ | 67.90 | 317 | 1.37 | 0 |

| No. | 2-Theta | intensity | distance(Å) | I/I0 |
|---|---|---|---|---|
| ① | 22.41 | 111 | 3.96 | 2 |
| ② | 31.80 | 86 | 2.81 | 2 |
| ③ | 39.92 | 4064 | 2.25 | 81 |
| ④ | 45.80 | 270 | 1.97 | 5 |
| ⑤ | 46.53 | 4987 | 1.94 | 100 |
| ⑥ | 67.77 | 353 | 1.38 | 7 |

SEMICONDUCTOR MEMORY DEVICE AND METHOD FOR FABRICATING THE SAME

This is a divisional of application Ser. No. 09/071,913 filed on May 5, 1998 now U.S. Pat. No. 6,136,639.

BACKGROUND OF THE INVENTION

1. Field of the Invention

The present invention relates to a semiconductor memory device and method for fabricating the same and, more particularly, to a semiconductor memory device and method for fabricating the same, which improves adhesion of the lower electrode of a ferroelectric planar capacitor, and prevents inter-diffusion between a Pt layer to be used as an electrode of the capacitor and a adhesion layer placed under the Pt layer.

2. Discussion of Related Art

In general, the area of a capacitor of a semiconductor memory device becomes small as the integration of the device increases. To compensate the decrease in the capacitance due to this capacitor area reduction, the thickness of the dielectric layer of the capacitor has been gradually decreased. However, the dielectric layer thickness reduction causes increase in leakage current due to tunneling, resulting in deterioration of reliability of the capacitor. To avoid extreme decrease in the thickness of the dielectric layer, a method is widely used in which the storage node of the capacitor has uneven surface to increase the effective area of the capacitor. In addition, a lamination structure of nitride/oxide or oxide/nitride/oxide which have high dielectric constants is used as the dielectric layer of the capacitor. However, this technique brings about severe step coverage on a substrate, making photolithography difficult and increasing fabrication cost. Thus, the above conventional method is difficult to apply to high-integration devices above 256M DRAM.

Accordingly, to increase the capacitance of the capacitor remarkably while its uneven surface is mitigated, there has been proposed and studied a method in which the capacitor dielectric layer is formed of a material with high dielectric constant. $Ta_2O_5$, a high dielectric material for capacitors, has been frequently studied and contributed to thinning of capacitor dielectric layer, characteristic improvement and integration of semiconductor memory devices. However, it is not expected that the $Ta_2O_5$ is widely used because its effective dielectric constant is not so high. Accordingly, ferroelectric has taken a growing interest recently as a dielectric material used in semiconductor devices. There are $BTO(BaTiO_3)$, $PZT[(Pb(Zr,Ti)O_3]$, $BTO(BaTiO_3)$ and $PLZT[(Pb,La) (Zr,TiO)O_3]$ as ferroelectric materials. However, these materials are easily reacted with silicon or polysilicon. Furthermore, the capacitor storage node is oxidized at strong oxidative ambient in the process of forming the capacitor dielectric layer of the aforementioned ferroelectric material. Thus, lots of researches are being performed for solving problems generated from actual fabrication processes.

FIGS. 1A to 1F are cross-sectional views showing a process of fabricating a conventional semiconductor memory device. Referring to FIG. 1A, a field oxide layer 3 is formed using a conventional process on a semiconductor substrate 1 in which a p-type well 2 is formed, dividing the substrate into an active region and field region. Referring to FIG. 1B, a gate electrode 4 is formed on a predetermined portion of the active region of semiconductor substrate 1, and n-type heavily doped impurity regions 5 to be used as source and drain are formed in p-type well 2, placed on both sides of gate electrode 4. In FIG. 1B, reference numeral 6 denotes a sidewall spacer for protecting or isolating gate electrode 4.

Referring to FIG. 1C, a first oxide layer 7 is formed on the overall surface of semiconductor substrate 1 including gate electrode 4, and Ti layer 8 and lower electrode 9 are sequentially formed on a predetermined portion of first oxide layer 7 placed on field oxide layer 3. Lower electrode 9 serves as the first electrode of a capacitor and is formed of Pt, and Ti layer 3 is for improving adhesion between lower electrode 9 and first oxide layer 7. Instead of Ti layer 7, Ta layer may be used. The Pt electrode used as lower electrode 9 has bad adhesion to the oxide layer. Thus, the adhesion layer like Ti layer or Ta layer is formed between the Pt electrode and oxide layer, improving the adhesion.

Referring to FIG. 1D, a ferroelectric layer 10 is formed on lower electrode 9, and upper electrode 11 is formed thereon, accomplishing a ferroelectric planar capacitor. Thereafter, a second oxide layer 12 is formed on first oxide layer 7 including upper electrode 11. Here, ferroelectric layer 10 is formed of $BST[(Ba,Sr)TiO_3]$, and upper electrode 11 is formed of Pt. Referring to FIG. 1E, photoresist PR is coated on second oxide layer 12 and patterned through exposure and development, to remove a portion of the photoresist, placed on upper electrode 11 and heavily doped impurity regions 5. Then, a portion of second oxide layer 12, placed on upper electrode 11, and portions of second and first oxide layers 12 and 7, placed on heavily doped impurity regions 5, are selectively removed through an etching process using the patterned photoresist PR as a mask, thereby exposing the surfaces of upper electrode 11 and heavily doped impurity regions 5.

Referring to FIG. 1F, after photoresist PR is removed, a barrier metal layer 13 is formed on upper electrode 11 including second oxide layer 12 and heavily doped impurity regions 5, Al layer 14 is formed thereon. Thereafter, portions of barrier metal layer 13 and Al layer 14, placed on gate electrode 4, are selectively removed through photolithography and etching processes. Barrier metal layer 13 is for reducing resistance generated due to direct contact of Al layer 14 and semiconductor substrate 1.

FIG. 2A is a cross-sectional view of another conventional semiconductor memory device, and FIG. 2B is a circuit diagram of the semiconductor memory device of FIG. 2A. Referring to FIG. 2A, the semiconductor memory device is constructed in such a manner that heavily doped impurity regions 21 serving as source and drain regions are formed in predetermined regions of a semiconductor substrate 20, a gate oxide layer 23 of paraelectric layer is formed on a channel region 22 placed between heavily doped impurity regions 21, lower electrodes 24 is formed on gate oxide layer 23, a ferroelectric layer 25 is formed on lower electrode 24, and upper electrode 26 is formed thereon. Upper electrode 26 comes into contact with a gate electrode (not shown) which is the word line of the semiconductor memory device.

In the above semiconductor memory device, since capacitance difference between gate oxide layer (paraelectric layer) 23 and ferroelectric layer 25 is large when the gate electrode (not shown) and capacitor are formed in a stack structure, the operation voltage of the device is required to be increased for polarization inversion of ferroelectric layer 25. When high voltage is applied to the ferroelectric in one direction, its crystal is polarized. This phenomenon remains even when the voltage is not applied to the ferroelectric.

FIGS. 3A to 3D are cross-sectional views showing a process of fabricating another conventional semiconductor memory device. This semiconductor memory device has been proposed to solve the problems of the above-mentioned semiconductor memory device shown in FIG. 2A, and is constructed in a manner that the ferroelectric layer is formed smaller than the gate electrode, to supply sufficient polarization inversion voltage to the ferroelectric capacitor and gate oxide layer even at low operation voltage. Referring to FIG. 3A, and oxide layer 31 is formed on a semiconductor substrate 30 and patterned through photolithography and etching processes, to form a contact hole 32, exposing a portion of semiconductor substrate 30. Here, an impurity region (not shown) serving as source of drain is formed in a portion of semiconductor substrate 30, exposed through contact hole 32.

Referring to FIG. 3B, a polysilicon plug 33 is formed in contact hole 32, and a Ti plug 34 is formed thereon. Thereafter, a TiN layer 35 is formed on the overall surface of oxide layer 31 including Ti plug 34 and patterned through photolithography and etching processes, to be left only on a capacitor region. The capacitor region corresponds to contact hole 32 and a portion of oxide layer in close proximity to the contact hole. TiN layer 35 is a barrier metal layer for preventing silicon diffusion from polysilicon plug 33. The silicon diffusion forms thin oxide layer on the lower electrode of the capacitor, which will be formed in the following process, to increase the resistance of the lower electrode and decrease the characteristic of the ferroelectric layer. To prevent these problems, polysilicon plug 33 and Ti plug 34 are formed, and then the barrier metal layer such as TiN layer 35 is formed on Ti plug 34 before the lower electric is formed.

Referring to FIG. 3C, Pt layer is formed on oxide layer 31 including TiN layer 35 and patterned, to be left only on TiN layer 35, forming lower electrode 36. Referring to FIG. 3D, a ferroelectric layer 37 is formed on lower electrode 36 and oxide layer 31, and upper electrode 33 is formed of Pt on ferroelectric layer 37, accomplishing a stack capacitor using the polysilicon plug. Here, ferroelectric layer 37 is formed of BST[(Ba,Sr)TiC$_3$]. The aforementioned conventional semiconductor memory device uses the ferroelectric layer with approximately 2000 of dielectric constant together with the Pt electrodes which hardly generate leakage current, to obtain good characteristic.

As described above, in the conventional semiconductor memory devices, the adhesion layer, formed of Ti or Ta, is formed between the Pt lower electrode and oxide layer, to improve adhesion between them. However, these devices have the following problems. First of all, Ti or Ta forming the barrier metal layer is diffused through grain boundary of the lower electrode (Pt) during heat cycle at above 600° C., to form $TiO_2$ on the lower electrode. Furthermore, $O_2$ of the ferroelectric layer, which passes the grain boundary of the Pt electrode, is diffused between the barrier metal layer formed of Ti and lower electrode, to form $TiO_2$ between them. That is, inter-diffusion is generated, to increase the resistance of the Pt electrode and barrier metal layer and deteriorate the ferroelectric characteristic, resulting in decrease in the reliability of the semiconductor memory device. Moreover, the Pt electrode interface is oxidized at strong oxidative ambient in the process of depositing of ferroelectric, generating volume expansion of the Pt electrode. Interface stress created in this process may cause peeling off of the Pt electrode, deteriorating the reliability of the semiconductor memory device.

SUMMARY OF THE INVENTION

Accordingly, the present invention is directed to a semiconductor memory device and method of fabricating the same that substantially obviates one or more of the problems due to limitations and disadvantages of the related art.

An object of the present invention is to provide a semiconductor memory device and method of fabricating the same, in which a paraelectric layer, having relation of lattice matching with the first electrode serving as the storage node of a capacitor, is formed under the first electrode, to improve adhesion of a ferroelectric planar capacitor and prevent inter-diffusion between a Pt layer serving as an electrode of the capacitor and an adhesion layer placed under the Pt layer, thereby increasing the reliability of the semiconductor memory device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device includes an insulating layer formed on a substrate, a paraelectric layer formed on the insulating layer, and a conductive layer formed on the paraelectric layer.

The method of fabricating a semiconductor memory device of the present invention includes the steps of forming a paraelectric layer on an insulating layer formed on a substrate, forming a first electrode on the paraelectric layer, forming a ferroelectric layer on the first electrode, and forming a second electrode on the ferroelectric layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

Figure 8:
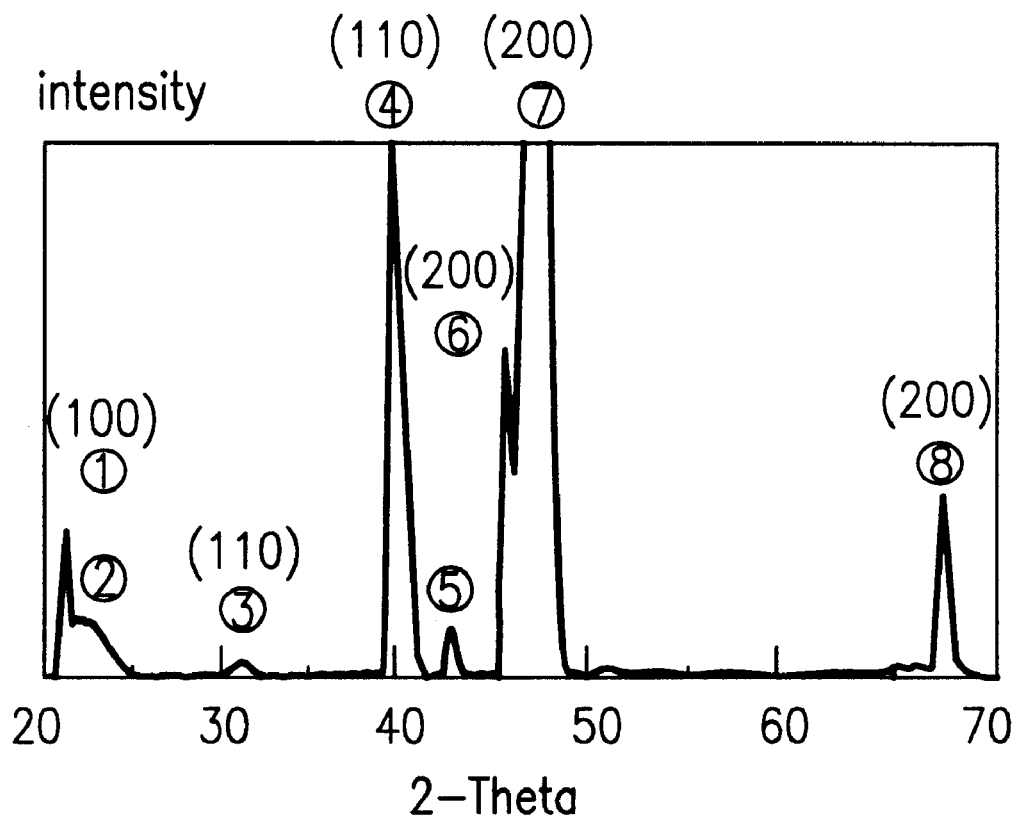
Figure 9:
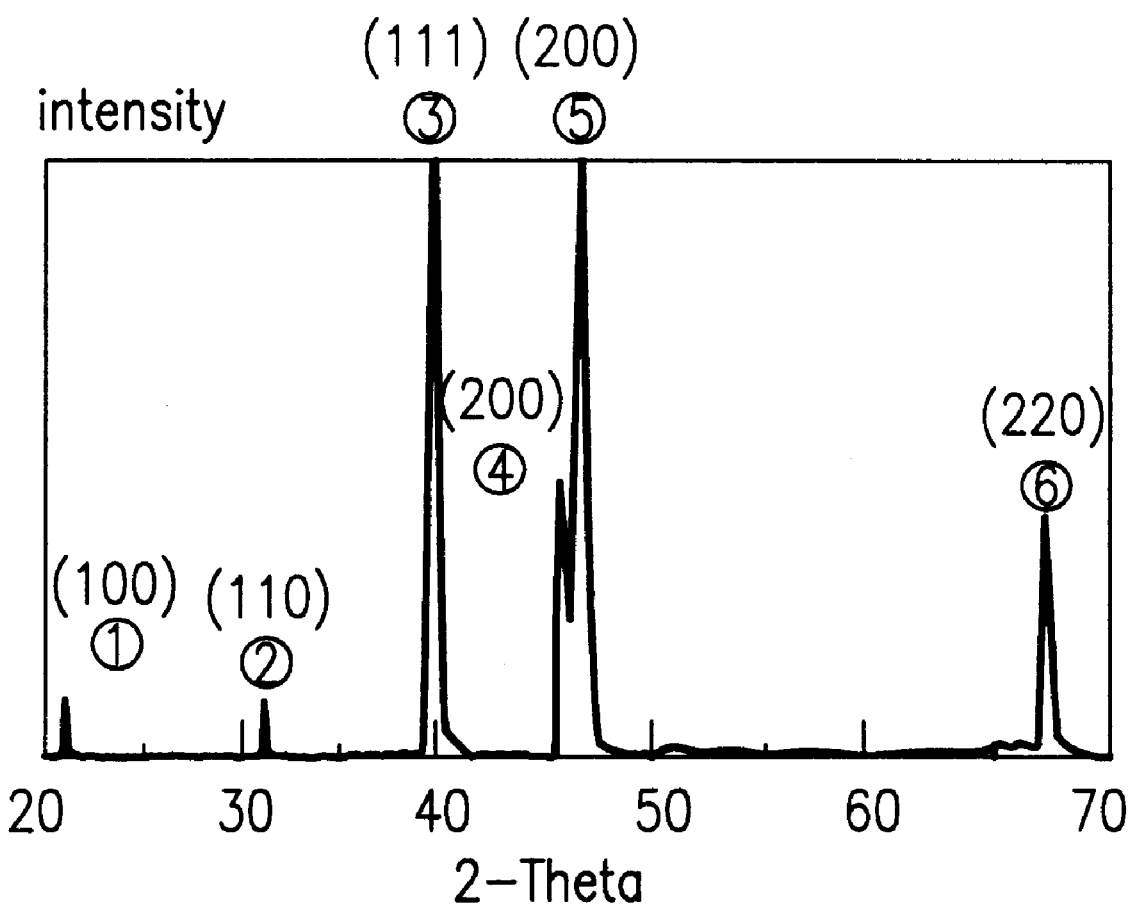

FIG. 8 is an XRD diagram showing a result obtained by measuring lattice matching through RBS when a paraelectric layer of BSTO is formed on a silicon oxide layer and a Pt layer is formed on the BSTO layer; and FIG. 9 is an XRD diagram showing a result obtained by measuring lattice matching through RBS when a paraelectric layer of BSTO is formed on a silicon oxide layer, a Pt layer to be used as the first electrode of a capacitor is formed on the BSTO layer, and then a ferroelectric layer is formed on the Pt layer.

DETAILED DESCRIPTION OF PREFERRED EMBODIMENT

Reference will now be made in detail to the preferred embodiment of the present invention, examples of which are illustrated in the accompanying drawings.

Figure 1A:
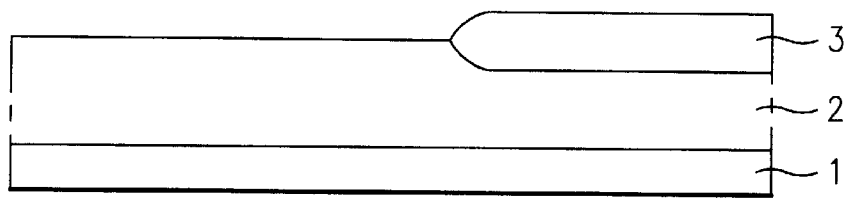
FIGS. 1A to 1F are cross-sectional views showing a process of fabricating a conventional semiconductor memory device.
Figure 1B:
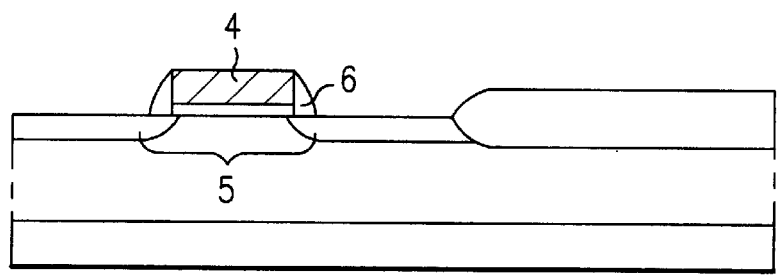
Figure 1C:
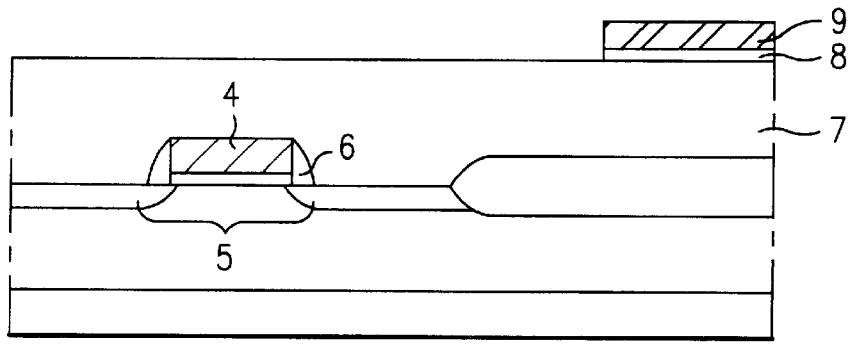
Figure 1D:
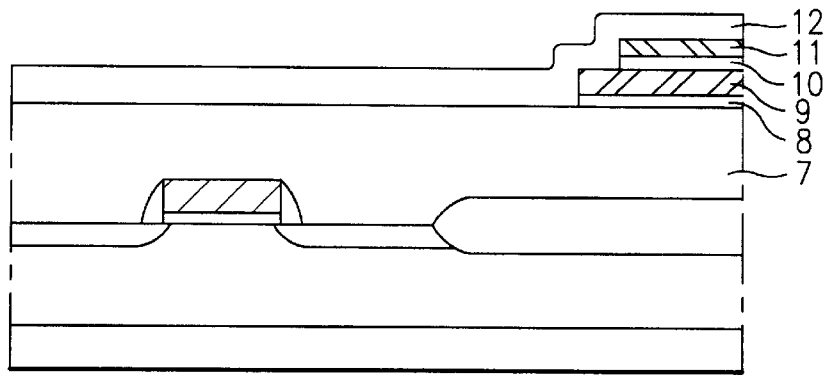
Figure 1E:
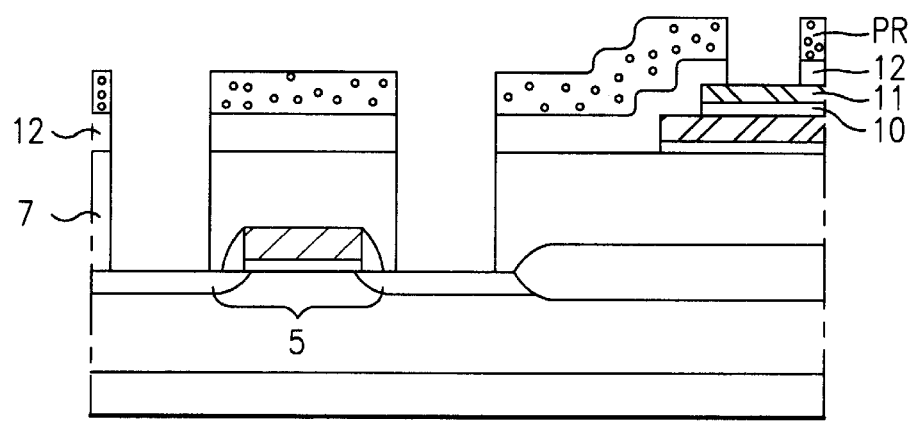
Figure 1F:
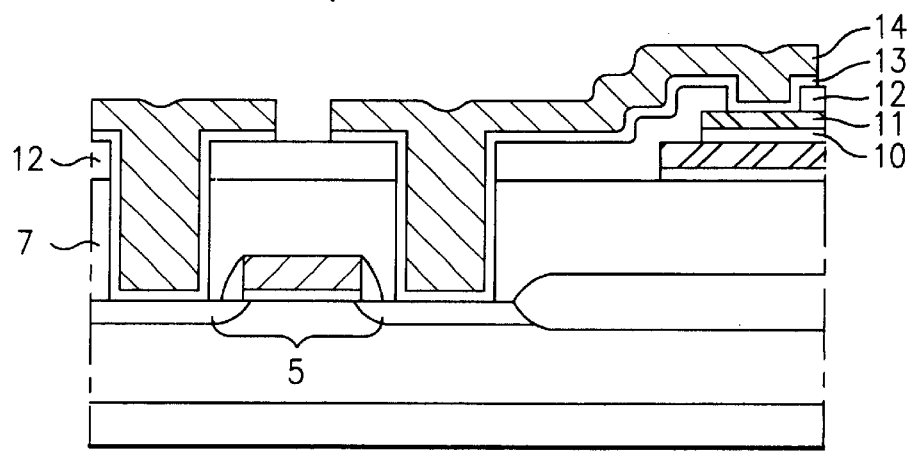
Figure 2A:
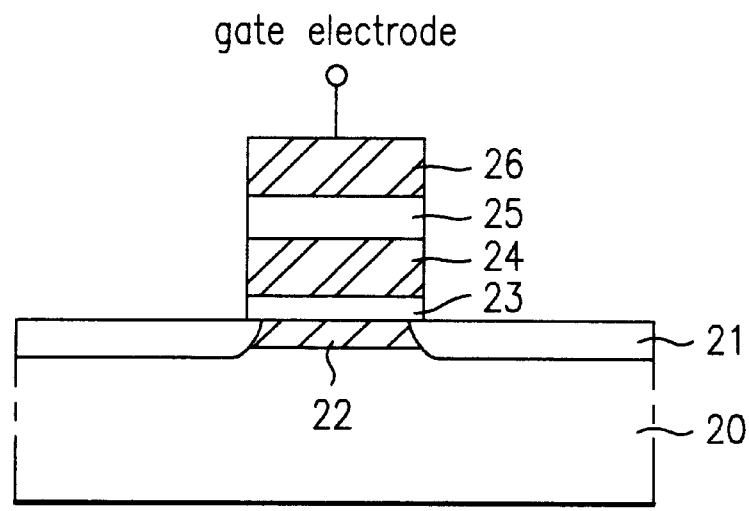
FIG. 2A is a cross-sectional view of another conventional semiconductor memory device.
Figure 2B:
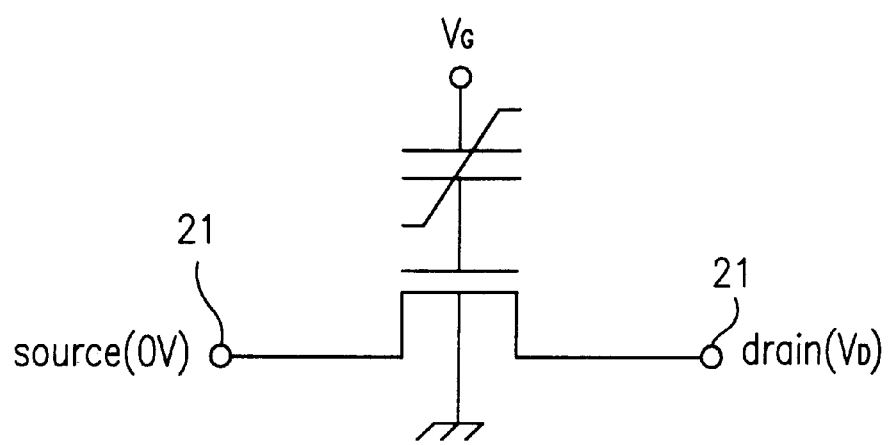
FIG. 2B is a circuit diagram of the semiconductor memory device of FIG. 2A.
Figure 3A:
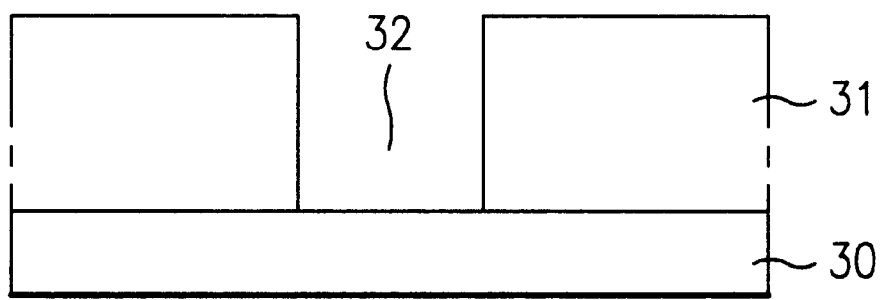
FIGS. 3A to 3D are cross-sectional views showing a fabricating another conventional semiconductor memory device.
Figure 3B:
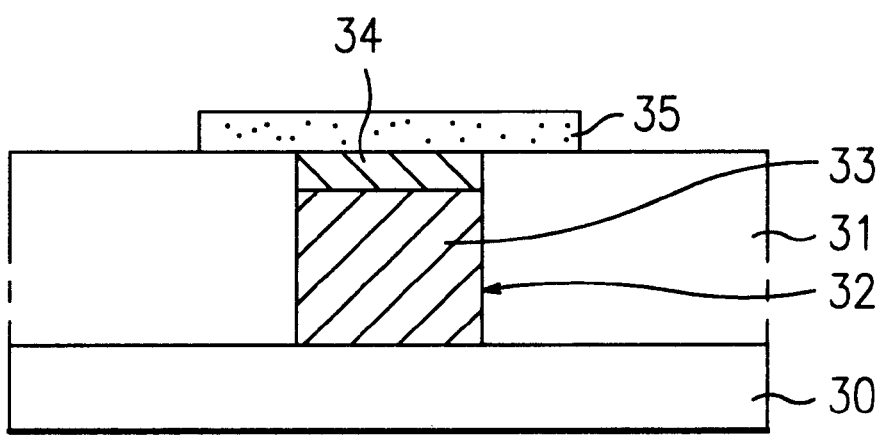
Figure 3C:
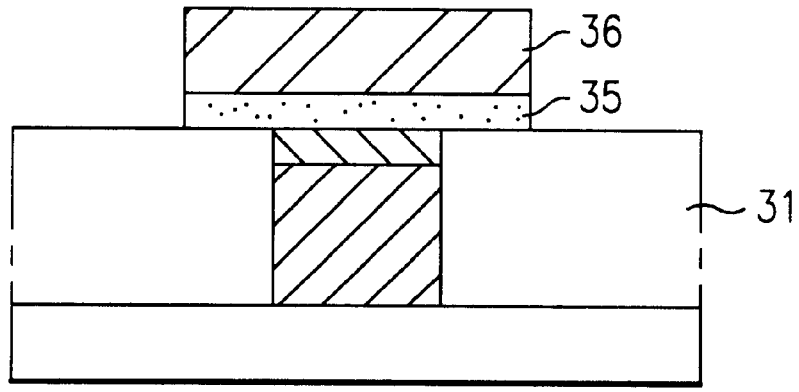
Figure 3D:
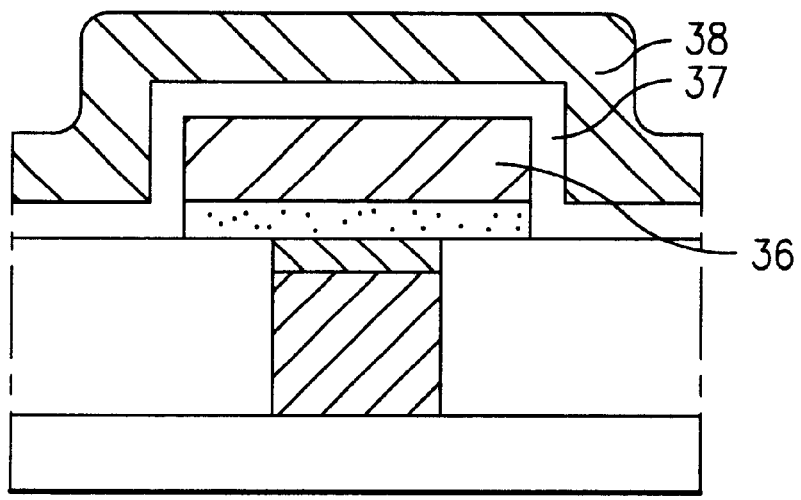
Figure 4:
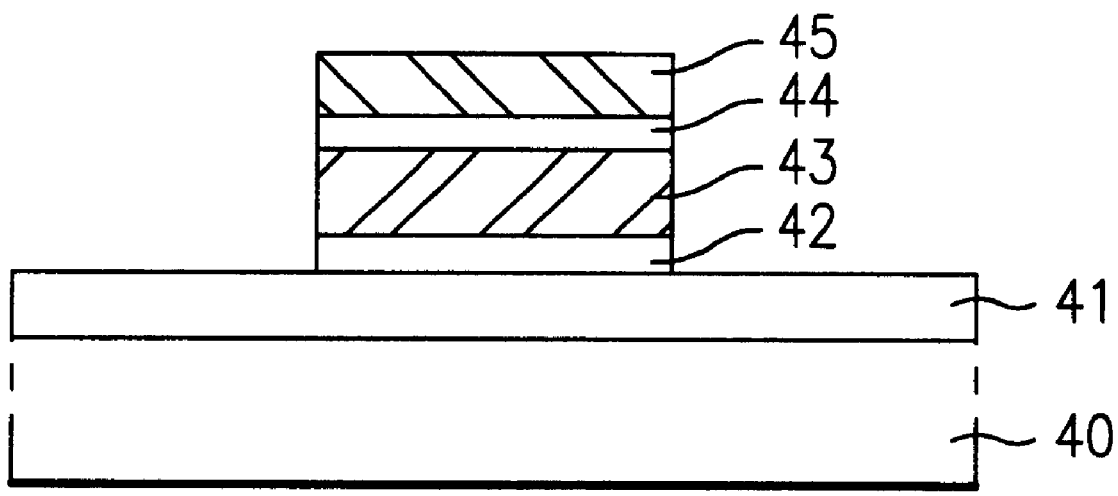
FIG. 4 is a cross-sectional view of a semiconductor memory device according to the present invention.

FIG. 4 is a cross-sectional view of a semiconductor memory device according to the present invention. Referring to FIG. 4, the semiconductor memory device of the present invention includes an insulating layer 41 formed on a substrate 40, a paraelectric layer 42 formed on insulating layer 41, a first electrode 43 formed on paraelectric layer 42, a ferroelectric layer formed on first electrode 43, and a second electrode 45 formed on ferroelectric layer 44. Insulating layer 41 is formed of amorphous insulator, and preferably, formed of one of oxide and nitride, or material including both of them. First and second electrodes 43 and 45 are formed of one of Pt and Ir. This is because these materials restrain the generation of leakage current. Paraelectric layer 42 is formed of a material having relation of lattice matching with the Pt or Ir, and preferably, formed of one of STO($SrTiO_3$ and BSTO[$(Ba,Sr)TiO_3$]. When the materials having relation of lattice matching with each other are sequentially formed, adhesion between them is good due to the matching relation. This lattice matching relation will be explained below in detail.

Ferroelectric layer 44 is formed of a ferroelectric material such as PZT[$(Pb(Zr,Ti)O_3$], PLZT[$(Pb,Li)$ $(Zr,Ti)O_3$], BTO ($BaTiO_3$) or BST[$(Ba,Sr)Ti)O_3$]. Here, BSTO, one of materials for forming paraelectric layer 42, and BST used for forming ferroelectric layer 44 are compounds that include at least one identical constituent, and they serve as the ferroelectric or paraelectric according to their compositions. The composition of BST, a compound of $(Ba,Sr)TiO_3$, determines whether it is ferroelectric or paraelectric, specifically, the composition of a Ba and Sr has a effect on the determination. That is, when the composition of Ba and Sr is 1, BST is used as ferroelectric in case that the composition of Ba is above 0.7, and used as paraelectric in case of below 0.5, on the basis of the normal temperature in bulk. In the present invention, it is denoted BSTC in case of paraelectric and BST in case of ferroelectric. Referentially, as shown in FIG. 4, paraelectric layer 42 is used as a material having paraelectric characteristic. In other words, since the underlaying layer of paraelectric layer 42 is amorphous layer, para electric layer has no relation with dielectric characteristic used in the capacitor.

Figure 5A:
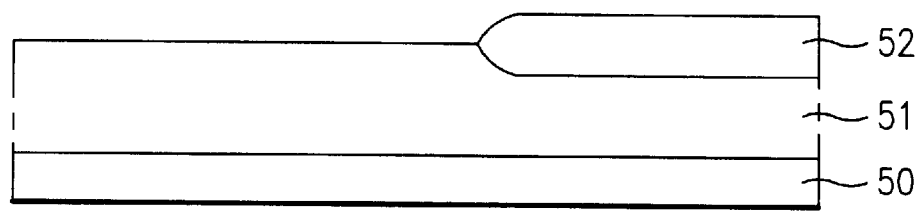
FIGS. 5A to 5F are cross-sectional views showing a process of fabricating a semiconductor memory device according to the present invention.

A method of fabricating the semiconductor memory device according to the present invention is explained below with reference to FIGS. 5A to 5F. FIGS. 5A to 5F are cross-sectional views showing a process of fabricating a semiconductor memory device according to an embodiment of the present invention. Referring to FIG. 5A, a field oxide layer 52 is formed using a conventional process on a semiconductor substrate 50 in which a well 51 is formed, dividing the substrate into an active region and field region.

Figure 5B:
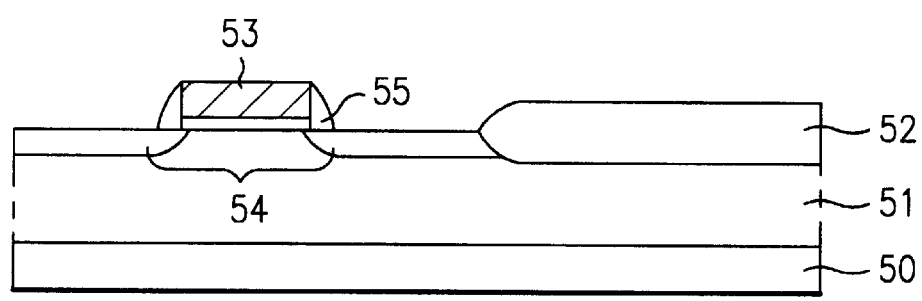

Referring to FIG. 5B, a gate electrode 53 is formed on a predetermined portion of the active region of semiconductor substrate 50, and heavily doped impurity regions 5 to be used as source and drain are formed in well 51, placed on both sides of gate electrode 53. In FIG. 5B, reference numeral 55 denotes a sidewall spacer for protecting or isolating gate electrodes 53.

Figure 5C:
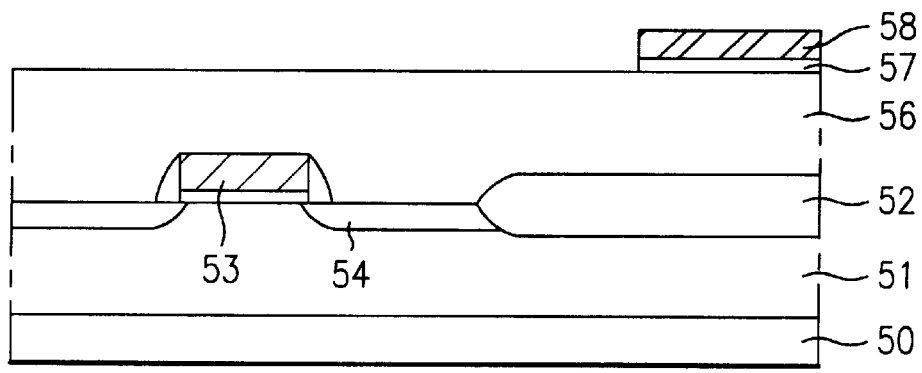

Referring to FIG. 5C, a first insulating layer 56 is formed on the overall surface of semiconductor substrate 50 including gate electrode 53, and a paraelectric layer 57 and capacitor first electrodes 58 are sequentially formed on a predetermined portion of first insulating layer 56 placed on field oxide layer 52. First insulating layer 56 is formed of one of oxide and nitride, or material including both of them, and first electrode 58 is formed of one of Pt or Ir. Paraelectric layer 57 is for improving adhesion between first electrode 58 and first insulating layer 56, and formed of a paraelectric material such as BSTO[$(Ba,Sr)TiO_3$] or STO($SrTiO_3$). The reason why paraelectric layer 57 is formed for improving adhesion between first electrode 58 and first insulating layer is that STO or BSTO is easily epitaxial-grown at above 600Å and has satisfactory characteristic of lattice matching with Pt, to increase adhesion between the first electrode and first insulating layer.

Here, the lattice matching characteristic is explained roughly. The lattice means a regular arrangement of an atom forming a crystal. Generally, a solid is divided into a crystalline line single crystal and polycrystalline, and amorphous material. A periodic arrangement of an atom in the above crystalline is called lattice. The lattice structure determines not only mechanical characteristic of crystalline but also its electrical characteristic. In case of electronic devices, the characteristic of periodic crystalline lattice determines energy taken by electronics participating in conduction process. Indication of faces or directions in a lattice is helpful to description of a crystal. As a conventional indication method, a system (Miller index) consisting of three integers is used, which indicates locations of planes and directions of vectors in the lattice. That is, the cubic faces of a cubic lattice structure are three-dimensional six faces, in which many planes in one lattice are identical and directions of the lattice are indicated by three integers because they have relation with vector.

These three integers indicate x, y and x which are vector directions of lattice. The direction of crystal in the lattice structure is generally shown as orientation (100) or (111). Orientation (100) indicates that the six cubic faces are equivalent in vertical and horizontal directions. In case of orientation (111), the vector directions of the lattice, x, y and z, correspond to diagonal triangle at a base point (0). Accordingly, the most stable lattice structure is the one with orientation (100). This stable lattice structure has relation with carrier's lift time and stability of electrical characteristic (change of resistance or inversion of polarity during heat cycle). Orientation (100) or (111) is measured in such a manner that a sample is exposed by X-ray, and 29 (angle) and distance between faces of the crystal of the sample are measured with RBS when the intensity of X-ray at a specific angle (for example, Y-axis on the basis of X-axis and Y-axis) is high, that is, when the X-ray diffracts by the orientation of the sample.

Figure 5D:
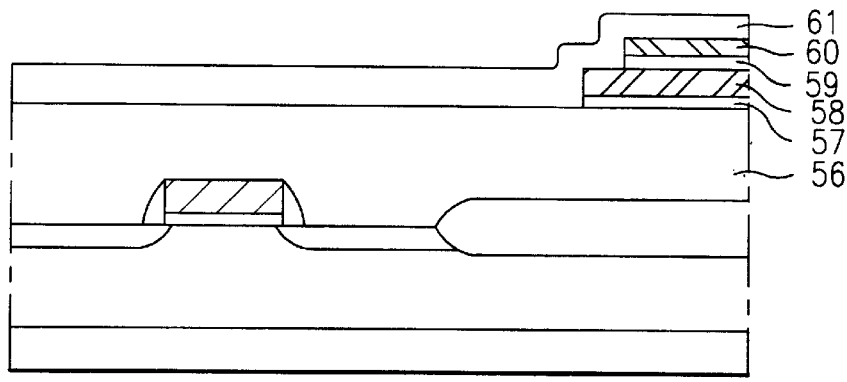

Referring to FIG. 5D, after ferroelectric layer 59 s formed on first electrode 58, a capacitor second electrode 60 is formed on ferroelectric layer 59, to accomplish a ferroelectric planar capacitor. Thereafter, a second insulating layer 61 is formed on first insulating layer 56 including second electrode 60. Ferroelectric layer 59 is formed of one of BST[(Ba,Sr)TiO₃], PZT[(Pb(Zr,Ti)O₃], PLZT[(Pb,Li) (Zr, Ti)O₃] and BTO(BaTiO₃), second electrode 60 is formed of Pt or Ir, and second insulating layer is formed of one of oxide and nitride.

Figure 5E:
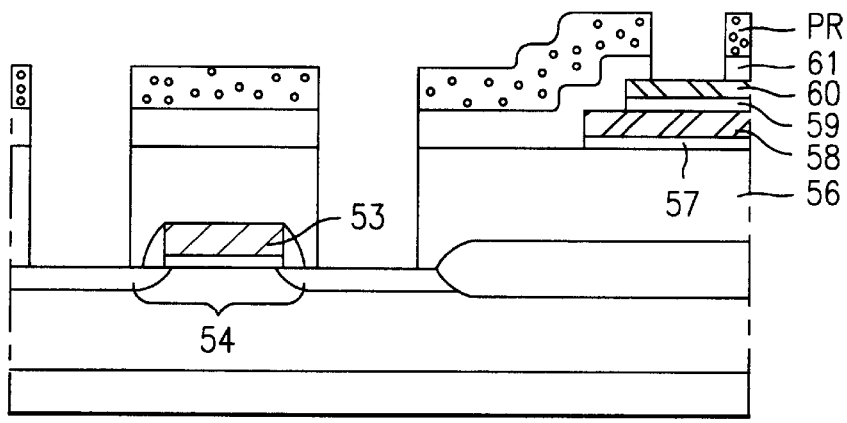

Referring to FIG. 5E, in order to electrically connect second electrode 60 to heavily doped impurity regions 54, photoresist PR is coated on second insulating layer 61 and patterned through exposure and development, to selectively remove portions of photoresist PR, placed on a second electrode 60 and heavily doped impurity regions 54. A portion of second insulating layer 61, placed on second electrode 60, and portions of second and first insulating layers 61 and 56, placed on heavily doped impurity regions 54, are selectively removed through an etching process using the patterned photoresist Pr as a mask, to expose the surfaces of second electrode 60 and heavily doped impurity regions 54.

Figure 5F:
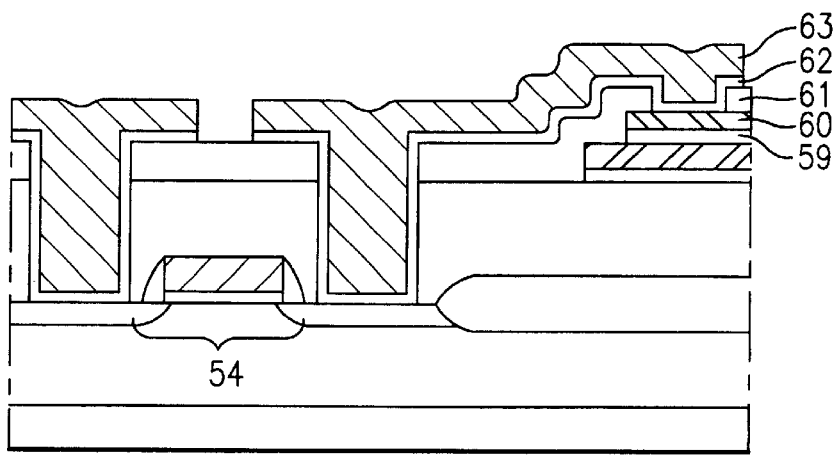

Referring to FIG. 5F, after the photoresist PR is removed, a barrier metal layer 62 is formed on a second electrode 60 including second insulating layer 61 and heavily doped impurity regions 54, and a conductive layer 63 is formed thereon. Then, portions of barrier metal layer 62 and conductive layer 63, placed on gate electrode 53, are selectively removed through photolithography and etching processes. Conductive layer 63 is formed of aluminum or tungsten, and barrier metal layer 62 is for reducing the contact resistance of the conductive layer formed of aluminum.

Figure 6:
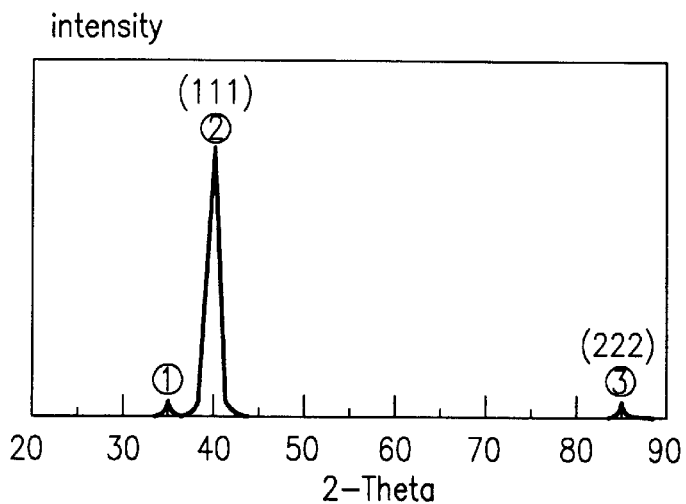
FIG. 6 is an X-ray diffraction (XRD) diagram showing a result obtained by measuring lattice matching through Rutherford Backscattering Spectrometry (RBS) when at Pt electrode is formed on a silicon oxide layer.

FIG. 6 is an XRD diagram showing a result obtained by measuring the lattice matching through RBS when the Pt electrode is formed on a silicon oxide layer. When the silicon oxide layer and Pt electrode is exposed by X-ray and lattice matching of them is measured using RBS apparatus, the lattice matching of Pt shows orientation (111) (2), as shown in FIG. 6. When Pt having weak leakage current characteristic is used as a material electrode of the capacitor, adhesion between the silicon oxide layer and Pt electrode is decreased because the lattice matching shows orientation (111) even though leakage current characteristic is improved. To prevent the adhesion deterioration, Ti or Ta is conventionally deposited between the Pt electrode and silicon oxide layer. In this case, however, Ti combines with oxygen atom of the ferroelectric layer, to increase the resistance of the ferroelectric layer, decreasing its dielectric constant. This also generates compressive stress. In addition, when Ti is directly formed on the silicon oxide layer, the lattice matching shows orientation (111).

Referring to FIG. 6, X-axis shows that the X-ray diffracts at 39.75° (2) of 2θ (angle) of the Pt crystal and distance between faces of the crystal is approximately 2.265 Å when the Pt layer is formed on the silicon oxide layer and exposed by X-ray to measure its crystal orientation. From this, it can be understood that the orientation of Pt crystal is (111). As described above, the lattice is a regular arrangement of an atom forming a crystalline so that the face orientation of the lattice can be measured by the crystal. In FIG. 6, I/IO indicates values obtained by dividing X-ray intensities of the materials denoted by numbers 1, 2 and 3 by the maximum X-ray intensity (for example, number 2).

Figure 7:
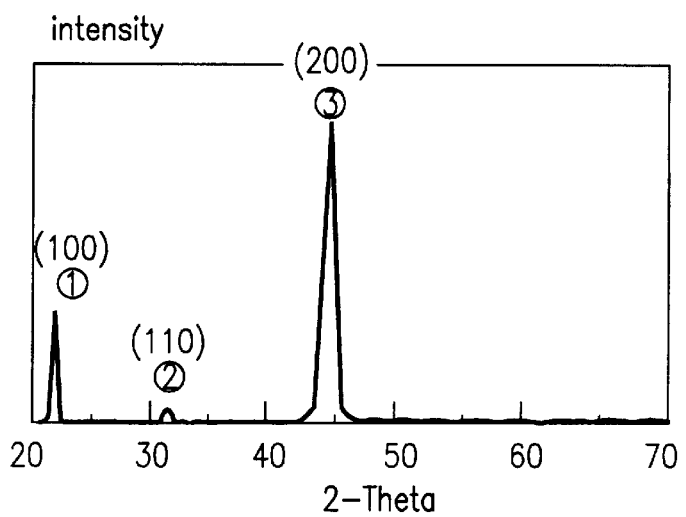
FIG. 7 is an XRD diagram showing a result obtained by measuring lattice matching through RBS when a paraelectric layer of BSTO is formed on a silicon oxide layer.

FIG. 7 is an XRD diagram showing a result obtained by measuring the lattice matching through RBS when the paraelectric layer of BSTO is formed on the silicon oxide layer. When the silicon oxide layer and BSTO are exposed by X-ray and the lattice matching of them is measured using RBS apparatus, the lattice matching shows priority orientation (100), as shown in FIG. 7. That is, the intensity of the X-ray shows a specific diffraction like orientations (100) and (200) (1) and (3). From this, it can be understood that BSTO is easily epitaxial-grown on the silicon oxide layer at above 600° C. Referring to FIG. 7, X-axis shows that the X-ray remarkably diffracts at 22.27° (1) and 45.45° (3) of 2θ (angle) of the BSTO crystal, and the distances between faces of the crystal are approximately 3.987 Å (1) and 1.903 Å (3) when the paraelectric layer of BSTO is formed on the silicon oxide layer and exposed using X-ray to measure its crystal orientation. Thus, it can be understood that the orientation of BSTO crystal is (100).

FIG. 8 is an XRD diagram showing a result obtained by measuring the lattice matching through RBS when the paraeletric layer of BSTO is formed on the silicon oxide layer and Pt layer is formed thereon. The lattice matching of the silicon oxide layer and BSTO, as shown in FIG. 6, shows priority orientation (100). With this result, when the Pt electrode is formed on the BSTO and exposed by X-ray, and the lattice matching of them is measured using RBS apparatus, the lattice matching of Pt shows priority orientations (111) (4) and (200) (7), as shown in FIG. 8. In other words, in case that the Pt electrode is formed on the paraelectric layer of BSTO, the lattice matching shows priority orientations (111) and (200) and intensity of priority orientation (111) (4) is considerably weaker than that of (200) (7). That is, most part of the Pt electrode formed on the BSTO shows stable priority orientation (200). Accordingly, the BSTO can be easily epitaxial-grown even at above 600° C., to form stable lattice matching. Furthermore, this stable lattice matching improves adhesion, remarkably restraining creation of hillock which generates when the Pt is processed at high temperature.

Referring to FIG. 8, X-axis shows that the X-ray diffracts at 40.01° (4) and 46.59° (7) of 2θ (angle) of Pt crystal, and the distances between faces of the crystal are approximately 2.25 Å and 1.94 Å (3) when the paraelectric layer of BSTO is formed on the silicon oxide layer, Pt lower electrode is formed thereon, and exposed using X-ray to measure the crystal orientation of Pt. Thus, it can be understood that the orientation of Pt crystal is (100).

FIG. 9 is an XRD diagram showing a result obtained by measuring the lattice matching through RBS when the paraelectric layer of BSTO is formed on the silicon oxide layer, Pt layer to be used as the first electrode of the capacitor is formed on the BSTO and the ferroelectric layer is formed on the Pt layer. From FIG. 9, it is confirmed that the lattice matching of silicon oxide layer, BSTO and Pt is stable. With this result, when the ferroelectric layer of BST is formed on the Pt electrode and exposed by X-ray, and the lattice matching is measured using RBS apparatus, the lattice matching of Pt shows the diffraction of X-ray at priority orientations (111) (3) and (200) (5) and the intensity of stable priority orientation (200) is stronger than that of (111), as shown in FIG. 9. The lattice matching of the BST placed on the Pt shows orientation (100) (1). The amount of saturation polarization of ferroelectric like BST or PZT is maximum when it has face orientations (100) and (001), and it is most stable for fatigue due to 180° domain switching. That is, the BST and PZT make rewriting of data easier.

Referring to FIG. 9, X-axis shows that the X-ray diffracts at 39.92° and 46.53° of 2θ (angle) of Pt crystal, and the distances between faces of the crystal are approximately 2.25 Å and 1.94 Å when the paraelectric layer of BSTO is formed on the silicon oxide layer, Pt electrode serving as the first electrode of the capacitor is formed on the BSTO, ferroelectric layer is formed on the Pt electrode and exposed using X-ray to measure the crystal orientation of Pt. In this case, the Pt crystal shows face orientations (111) and (200).

The intensity in case of orientation (111) is 4064 (3) and intensity in case of orientation (200) is 4984 (5). That is, Pt has stable orientation (200) more than other orientations. Moreover, the lattice matching of the BST placed on Pt shows orientation (100) (1) so that it can be understood that stable lattice matching is made even when the BST is formed on Pt.

As described above, the present invention can obtains the same result even when the paraelectric layer is formed on a silicon nitride layer instead of silicon oxide layer, and capacitor electrode is formed of Ir instead of Pt. Furthermore, PZT, PLZT and BTO may be used as the ferroelectric instead of BST. According to the present invention, the paraelectric layer having an identical face orientation is formed between the Pt electrode and silicon oxide layer, to improve adhesion between them. This prevents hillock of Pt generated due to compressive stress of Pt and silicon oxide, increasing the reliability of semiconductor memory devices. Furthermore, the paraelectric layer, which can be easily epitaxial-grown at above 600° C., is used as the adhesion layer, to solve the inter-diffusion problem generated due to Ti or Ta. Accordingly, it is possible to make the most of characteristics of the semiconductor memory device using the ferroelectric layer, and provide stable memory device.

It will be apparent to those skilled in the art that various modifications and variations can be made in the semiconductor memory device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor memory device, comprising:

an insulating layer formed on a substrate;

a paraelectric layer formed on the insulating layer;

a conductive layer formed on the paraelectric layer;

a ferroelectric layer formed on the conductive layer; and a second conductive layer formed on the ferroelectric conductive layer;

wherein the conductive layer is formed in lattice matching with the paraelectric layer and the conductive layer is formed in lattice matching with the ferroelectric layer.

2. The semiconductor memory device as claimed in claim 1, wherein the insulating layer is formed of at least one of oxide and nitride.

3. The semiconductor memory device as claimed in claim 2, wherein the oxide has priority orientation (100).

4. The semiconductor memory device as claimed in claim 1, wherein the paraelectric layer is formed of at least one of STO(SrTiO$_3$) and BSTO[(Ba,Sr)TiO$_3$].

5. The semiconductor memory device as claimed in claim 1, wherein the conductive layer is formed in lattice matching with the paraelectric layer.

6. The semiconductor memory device as claimed in claim 1, wherein the conductive layer is formed of at least one of Pt and Ir.

7. The semiconductor memory device as claimed in claim 1, wherein the ferroelectric conductive layer and second conductive layer are sequentially formed on the conductive layer.

8. The semiconductor memory device as claimed in claim 7, wherein the ferroelectric conductive layer is formed in lattice matching with the conductive layer.

9. The semiconductor memory device as claimed in claim 7, wherein the ferroelectric layer is formed of at least one of BST[(Ba,Sr)TiO$_3$], BTO(BaTiO$_3$), PZT[(Pb(Zr,Ti)O$_3$] and PLZT[(Pb,Li) (Zr,Ti)O$_3$].

10. The semiconductor memory device as claimed in claim 7, wherein the ferroelectric layer and paraelectric layer are formed of materials including identical constituents.

11. The semiconductor memory device as claimed in claim 7, wherein the second conductive layer is formed of at least one of Pt and Ir.

* * * * *